US007814401B2

(12) United States Patent
Alrod et al.

(10) Patent No.: US 7,814,401 B2
(45) Date of Patent: Oct. 12, 2010

(54) SOFT DECODING OF HARD AND SOFT BITS READ FROM A FLASH MEMORY

(75) Inventors: Idan Alrod, Tel Aviv (IL); Eran Sharon, Rishon Lezion (IL); Simon Litsyn, Giv'at Shmuel (IL); Menahem Lasser, Kohav Yair (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 923 days.

(21) Appl. No.: 11/642,708

(22) Filed: Dec. 21, 2006

(65) Prior Publication Data

US 2008/0151617 A1 Jun. 26, 2008

(51) Int. Cl.
*H03M 13/00* (2006.01)
(52) U.S. Cl. .................... 714/794; 714/763
(58) Field of Classification Search ............ 714/763, 714/795
See application file for complete search history.

(56) References Cited

U.S. PATENT DOCUMENTS

| 5,404,485 | A | 4/1995 | Ban |
| 6,418,172 | B1 | 7/2002 | Raghavan et al. |
| 6,751,766 | B2 | 6/2004 | Guterman et al. |
| 7,023,735 | B2 | 4/2006 | Ban et al. |
| 2003/0217323 | A1 | 11/2003 | Guterman |
| 2005/0013165 | A1 | 1/2005 | Ban |
| 2007/0266296 | A1* | 11/2007 | Conley ................. 714/763 |
| 2008/0092014 | A1* | 4/2008 | Brandman et al. ...... 714/763 |

FOREIGN PATENT DOCUMENTS

| EP | 1137 001 | 9/2001 |
| WO | WO 2004/112040 | 12/2004 |
| WO | WO 2008/452953 | 4/2008 |

OTHER PUBLICATIONS

U.S. Appl. No. 11/514,182, filed Sep. 2006, Litsyn et al.
George C. Clark Jr. and J. Bibb Cain, Error Correction Coding for Digital Communications (Springer 1981).
S. Lin and DJ Costello, Error Control Coding: Fundamentals and Applications (PH,1983).
Branka Vucetic and Jinhong Yuan, Turbo Codes: Principles and Applications (Kluwer 2000).
Andrei Vitayev and Paul H. Siegel "On Viterby DeCoder Path Metric Differences" IEEE Transactions on Communications, vol. 46, No. 12, pp. 1549-1554 (Dec. 1998).
Andries P. Hekstra "An Alternative Metric Rescaling In Viterby Decoders" IEEE Transactions on Communications, vol. 37, No. 11, pp. 1220-1222 (Nov. 1989).

(Continued)

*Primary Examiner*—Sam Rizk
(74) *Attorney, Agent, or Firm*—Mark M. Friedman

(57) ABSTRACT

To read one or more flash memory cells, the threshold voltage of each cell is compared to at least one integral reference voltage and to at least one fractional reference voltage. Based on the comparisons, a respective estimated probability measure of each bit of an original bit pattern of each cell is calculated. This provides a plurality of estimated probability measures. Based at least in part on at least two of the estimated probability measures, respective original bit patterns of the cells are estimated. Preferably, the estimated probability measures are initial probability measures that are transformed to final probability measures under the constraint that the bit pattern(s) (collectively) is/are a member of a candidate set, e.g. a set of codewords.

21 Claims, 6 Drawing Sheets

OTHER PUBLICATIONS

C.R. Hartman and L.D. Rudoph "An Optimum Symbol-by-Symbol Decoding Rule for Linear Codes", IEEE Transactions on Information Theory, vol. 22, No. 5, pp. 514-517 (1976).

Fragiacomo S.; Matrakidis, C.; O;Reilly, J., "Novel Near Maximum Likelihood Soft Decision Decoding Algorithim for Linear Block Codes"; Communications, IEEE Proceedings- vol. 146, Issue 5, pp. 265-270 (Oct. 1999).

* cited by examiner

SOFT DECODING OF HARD AND SOFT BITS READ FROM A FLASH MEMORY

FIELD AND BACKGROUND OF THE INVENTION

The present invention relates to storage of data in nonvolatile memories such as flash memories and, more particularly, to a method of reading data stored in a flash memory by reading both hard bits and soft bits and then jointly decoding all the read bits.

Originally, flash memories stored only one bit per cell. Flash memories that store two bits per cell now are available commercially, and flash memories that store more than two bits per cell are being developed. Flash memories that store one bit per cell are called "Single Level Cell" (SLC) memories. Flash memories that store more than one bit per cell are called "Multi Level Cell" (MLC) memories.

FIG. 1 illustrates how a bit pattern of three bits is stored in a MLC memory that is capable of storing three bits per cell.

A flash memory cell is a transistor with two gates: a conventional control gate and a floating gate. Data are written to the cell by injecting electrons into the floating gate. These injected electrons oppose the "reference" voltage that is applied to the control gate, and the cell does not conduct unless the reference voltage is sufficiently high to overcome the charge on the floating gate. The lowest reference voltage that is sufficiently high to overcome the charge on a flash memory cell's floating gate is called the cell's "threshold voltage" herein.

The threshold voltage of a flash memory cell is in a range, called the "voltage window", from a minimum value $V_{min}$ to a maximum value $V_{max}$. For historical reasons, writing data to a flash cell is called "programming" the flash cell. This is done by applying voltage pulses to the cell, to inject electrons from the cell's silicon substrate through the cell's oxide layer into the cell's floating gate, until the threshold voltage of the cell is higher than a "verify" voltage level associated with representation of the desired bit pattern. (The verify voltage level is called a "verify" voltage level because programming the cell includes verifying that the cell's threshold voltage exceeds this level.) In a three-bit-per-cell memory, the voltage window is divided into eight voltage bands: from $V_{min}$ to $V_1$, from $V_1$ to $V_2$, from $V_2$ to $V_3$, from $V_3$ to $V_4$, from $V_4$ to $V_5$, from $V_5$ to $V_6$, from $V_6$ to $V_7$ and from $V_7$ to $V_{max}$. A threshold voltage within one of the voltage bands represents a bit pattern as shown in FIG. 1: a threshold voltage between $V_{min}$ and $V_1$ represents the bit pattern "111", a threshold voltage between $V_1$ and $V_2$ represents the bit pattern "110", etc. In general, the voltage window of a m-bit-per-cell memory is divided into $2^m$ voltage bands.

To read a flash cell, the threshold voltage of the flash cell is compared to the reference voltages that define the voltage bands. (These reference voltage levels also are called "read voltage levels", or "read levels" for short.) In the case of some flash memories (hereinafter called "type 1" memories), reading a cell that stores a bit pattern of m bits requires m such comparisons. For example, when m=3, as illustrated in FIG. 1, the cell's threshold voltage first is compared to $V_4$. Depending on the outcome of that comparison, the cell's threshold voltage is compared to either reference voltage $V_2$ or reference voltage $V_6$. Depending on the outcome of the second comparison, the cell's threshold voltage is compared to either reference voltage $V_1$ or reference voltage $V_3$ or reference voltage $V_5$ or reference voltage $V_7$. Note that this comparison does not assume prior knowledge of the cell's threshold voltage: circuitry in the flash memory returns a signal indicating whether the cell's threshold voltage is higher or lower than the reference voltage to which it is being compared.

In the case of some other flash memories (hereinafter called "type 2 memories"), the threshold voltage values of all the cells that are read collectively are compared to all $2^m-1$ reference voltages between $V_{min}$ and $V_{max}$.

In a collection of flash cells, the threshold voltages of the cells are distributed statistically around the centers of their respective voltage bands. FIG. 1 shows the cell's threshold voltages in the first voltage band distributed according to a distribution curve 10, the cell's threshold voltages in the second voltage band distributed according to a distribution curve 12, the cell's threshold voltages in the third voltage band distributed according to a distribution curve 14, the cell's threshold voltages in the fourth voltage band distributed according to a distribution curve 16, the cell's threshold voltages in the fifth band distributed according to a distribution curve 18, the cell's threshold voltages in the sixth band distributed according to a distribution curve 20, the cell's threshold voltages in the seventh band distributed according to a distribution curve 22 and the threshold voltages in the eighth band distributed according to a distribution curve 24. There are several reasons for the finite widths of these distributions:

1. The programming process is a stochastic one that relies on inherently stochastic processes such as quantum mechanical tunneling and hot injection.

2. The precision of the read/program circuitry is finite and is limited by random noise.

3. In some flash technologies, the threshold voltage of a cell being read is affected by the threshold voltages of neighboring cells.

4. Chip-to-chip variations and variations in the manufacturing process cause some cells to behave differently than other cells when read/programmed.

In addition, the cell threshold voltage distributions tend to change over time, as follows:

1. As a flash memory is programmed and erased, the sizes of the voltage window and the voltage bands tend to change. These phenomena limit the number of times a MLC flash memory can be erased and re-programmed.

2. The threshold voltage of a flash cell that is not programmed for a long time tends to drift downward (to the left in FIG. 1). This phenomenon limits the time that data can be reliably retained in a flash memory.

The voltage bands of a flash cell should be designed to be wide enough to accommodate all these phenomena, but not too wide. A voltage band that is too narrow, relative to the associated threshold voltage distribution curve and relative to the drift of that curve over time, leads to an unacceptably high bit error rate. Making the voltage bands very wide relative to the associated threshold voltage distributions limits the number of bits in the bit patterns that can be stored reliably in the flash cell. In practice, flash memories are designed to have one error per $10^{14}$-$10^{16}$ bits read. Some flash technologies are unable to achieve this error rate while storing the desired number of bits per cell. Some flash memories based on such technology use error correction circuits to compensate for their high intrinsic error rates. Some NAND flash manufacturers have instructed their customers to incorporate error-correcting code in their applications.

Reference voltages, such as the reference voltages illustrated in FIG. 1, that demark the boundaries of the voltage bands inside the voltage window, are termed "integral reference voltages" herein. The use, in addition to integral reference voltages, of reference voltages that lie within voltage bands, has been proposed, e.g. by Ban, U.S. Pat. No. 7,023,735 and by Guterman et al., U.S. Pat. No. 6,751,766; such reference voltages are termed "fractional reference voltages" herein. Note that the voltages that define the voltage window itself ($V_{min}$ and $V_{max}$ in FIG. 1) are not considered reference voltages herein.

FIG. 2 is FIG. 1 with the addition of eight fractional reference voltages, $V_{0.5}$, $V_{1.5}$, $V_{2.5}$, $V_{3.5}$, $V_{4.5}$, $V_{5.5}$, $V_{6.5}$ and $V_{7.5}$, in the centers of their respective voltage bands. In general, a flash cell for storing m bits has $2^m$ voltage bands and so has $2^m-1$ integral reference voltages. For example, in the case of a type 1 flash memory whose cells are read with m comparisons of a flash cell's threshold voltage to m of the $2^m-1$ integral reference voltages, reading such a flash cell may also include comparing the flash cell's threshold voltages to one or more of the fractional voltages that lie between $V_1$ and $V_{2^m-1}$. For example, the last two comparisons of the flash cell's threshold voltage to the integral reference voltages $V_1$ through $V_{2^m-1}$ generally are to two consecutive such integral reference voltages. The fractional reference voltage to which the cell's threshold voltage then is compared typically lies between those two consecutive integral reference voltages.

In the case of a type 2 flash memory whose cells are read by comparing the cells' threshold voltages to all $2^m-1$ integral reference voltages, it may be necessary to compare the cells' threshold voltages to most or all of the fractional reference voltages that are defined to lie within the voltage bands.

The hardware that is used to compare a cell's threshold voltage to fractional reference voltages is the same as the analog-to-digital hardware that is used in the prior art to compare a cell's threshold voltage to integral reference voltages, for example a voltage comparator.

The information obtained by comparing the threshold voltages of flash cells only to integral reference voltages often is called "hard bits". The additional information obtained by also comparing the threshold voltages of the flash cells to fractional reference voltages often is called "soft bits". This terminology is used herein. For example, determining that the threshold voltage of one of the cells of FIG. 1 lies between $V_1$ and $V_2$ provides the information that the cell stores the hard bits "110". Determining that the threshold voltage of the cell lies between $V_1$ and $V_{1.5}$ or between $V_{1.5}$ and $V_2$ provides an additional soft bit of information. Whether this soft bit is called "1" or "0" is arbitrary, but the usual convention is to follow the convention illustrated in FIG. 1 and associate "1" bits with low fractional reference voltages and "0" bits with high fractional reference voltages. So the soft bit obtained by determining that the cell's threshold voltage is between $V_1$ and $V_{1.5}$ is "1" and the soft bit obtained by determining that the cell's threshold voltage is between $V_{1.5}$ and $V_2$ is "0".

As noted above, for historical reasons, the process of writing hard bits to one or more flash cells is called "programming" the cells. The existence of the phenomena described above that give rise to cell threshold voltage distributions and that cause these distributions to change over time implies that when a flash cell is read there is a small but finite probability that the hard bits that are read are not the hard bits with which the cell was programmed. Therefore, it is conventional to write data to a flash memory by programming the cells of the memory with codewords, determined according to an error-correcting code (ECC), that represent the data redundantly. The techniques of "encoding" information into codewords can be classified within two different methods. The first method, called "systematic" encoding, appends redundancy symbols to information to form a codeword. In a systematic codeword, the bits that correspond to the information always are distinguishable from the redundancy bits. The second method, called "nonsystematic" encoding, encodes the information as codewords that are functions of the information and in which it is not possible to identify bits that correspond to the information bits. When flash cells that have been programmed with codewords are read, the results of the reading may not be identical to the codewords with which the cells were programmed. Therefore, the results of such reading are called herein "representations" of the codewords with which the cells were programmed. The process of recovering, from a representation of a codeword, the information bits from which the codeword originally was constructed, is called "decoding" the representation of the codeword to obtain a valid codeword that hopefully is the original codeword. Applying a well-designed ECC decoding algorithm to a representation of a codeword recovers the information from which the codeword originally was constructed, even if some of the bits of the representation of the codeword are not the same as the corresponding bits of the codeword.

In the Ban patent, soft bits are used by the ECC module for estimating the reliability of hard bits. In the Guterman et al. patent, soft bits are used by the ECC module to resolve ambiguities in deciding which hard bits should be corrected. There also are prior art communication systems that use similar approaches to overcome channel noise: extra high-resolution bits, that are analogous to the "soft bits" defined above, are used to improve the decoder's error correction performance.

Another way of classifying an ECC decoding algorithm is according to whether the algorithm is a "hard" decoding algorithm or a "soft" decoding algorithm. The input to a "hard" decoding algorithm is just the value of the codeword bits themselves, as read (or as received, in the case of a communication channel). The input to a "soft" decoding algorithm is, for each bit of the codeword, a probability measure that the bit that has been read (or received) is the same as the bit that was written (or transmitted). Often, this probability is expressed as a log likelihood ratio (LLR), i.e., the logarithm of the ratio of the probability that the bit that was written (or transmitted) was "0" to the probability that the bit that was written (or transmitted) was "1", given the read threshold voltage. Soft decoding algorithms are described e.g. in George C. Clark, Jr. and J. Bibb Cain, *Error Correction Coding for Digital Communications* (Springer, 1981), in S. Lin and D. J. Costello, *Error Control Coding: Fundamentals and Applications* (Prentice-Hall, 1983) and in Branka Vucetic and Jinhong Yuan, Turbo Codes: Principles and Applications (Kluwer, 2000).

Heretofore, soft decoding ECC algorithms have been used almost exclusively in contexts other than data storage systems, for example, in signal processing fields such as communications, voice coding and image processing. The majority of academic research on ECC is done in the context of communications. Indeed, the three prior art references cited above on soft decoding are directed at the use of soft ECC algorithms in communication. The ECC decoders of the Ban patent and of the Guterman et al. patent are hard decoders: the soft bits are used only to provide qualitative information about the hard bits. Only recently has the use of soft decoders been proposed, in co-pending U.S. patent application Ser. No. 11/514,182, to decode hard bit representations of codewords read from nonvolatile memories such as flash memories. Heretofore, soft decoding has not been used in conjunction with soft bits to decode representations of codewords read from nonvolatile memories such as flash memories.

SUMMARY OF THE INVENTION

According to the present invention there is provided a method of reading at least one flash memory cell, including the steps of: (a) for each cell: (i) comparing a threshold voltage of the each cell to at least one integral reference voltage, (ii) comparing the threshold voltage of the each cell to at least one fractional reference voltage, and (iii) based at least in part on outcomes of the comparisons, calculating a respective estimated probability measure of each bit of a bit pattern of the each cell, thereby obtaining a plurality of estimated probability measures; and (b) estimating a respective original bit pattern of each cell, based at least in part on at least two of the estimated probability measures.

According to the present invention there is provided a memory device including: (a) at least one flash memory cell; and (b) a controller operative to read the at least one cell by: (i) for each cell: (A) comparing a threshold voltage of the each cell to at least one integral reference voltage, (B) comparing the threshold voltage of the each cell to at least one fractional reference voltage, and (C) based at least in part on outcomes of the comparisons, calculating a respective estimated probability measure of each bit of a bit pattern of the each cell, thereby obtaining a plurality of estimated probability measures, and (ii) estimating a respective original bit pattern of each cell, based at least in part on at least two of the estimated probability measures.

According to the present invention there is provided a system including: (a) a memory device that includes at least one flash memory cell; and (b) a processor operative to read the at least one cell by: (i) for each cell: (A) comparing a threshold voltage of the each cell to at least one integral reference voltage, (B) comparing the threshold voltage of the each cell to at least one fractional reference voltage, and (C) based at least in part on outcomes of the comparisons, calculating a respective estimated probability measure of each bit of a bit pattern of the each cell, thereby obtaining a plurality of estimated probability measures, and (ii) estimating a respective original bit pattern of each cell, based at least in part on at least two of the estimated probability measures.

The basic method of the present invention is a method of reading one or more cells of a flash memory. Each cell's threshold voltage is compared to at least one integral reference voltage and to at least one fractional reference voltage. Based at least in part on the outcomes of those comparisons, a respective estimated probability measure of each bit of a bit pattern of the cell is calculated. This respective estimated probability measure can be e.g. the probability itself that the bit originally was written to the cell as "0", or the probability itself that the bit originally was written to the cell as "1", or a LLR that expresses the likelihood of the bit originally having been written as "0" or "1", or other probability measures as discussed below. In the case of a SLC, there is only one bit in the bit pattern. In the case of a MLC, there are two or more bits in the bit pattern.

The result of this estimating is a plurality of estimated probability measures. It is important to note that the scope of the invention does not include the case of comparing the threshold voltage of a single SLC, considered in isolation, to $V_1$ and to one or more fractional reference voltages, and then estimating a single probability measure. Finally, the original bit pattern(s) of the cell(s), i.e., the bit pattern(s) originally stored in the cell(s), is/are estimated, based at least in part on at least two of the estimated probability measures.

Typically, as in the case of MLCs, the threshold voltage(s) is/are compared to a plurality of integral reference voltages.

Preferably, the estimated probability measures are initial estimated probability measures, which means that the estimated probability measures are input to the step of estimating the original bit pattern(s) rather than intermediate results of the estimation of the original bit pattern(s). More preferably, the estimating of the original bit pattern(s) includes transforming the initial estimated probability measures to final estimated probability measures. Most preferably, transforming the initial estimated probability measures into the final estimated probability measures is constrained by requiring the original bit pattern(s) to constitute, when taken together as a single unit, a member of a set of candidates, e.g. a member of a set of codewords. Also most preferably, the estimating of the original bit pattern(s) is based on the final estimated probability measures.

Preferred methods of estimating the original bit pattern(s) include maximum a-posteriori probability decoding and maximum likelihood decoding. Preferred examples of maximum likelihood decoding include maximum likelihood sequence estimation decoding and reduced-set maximum likelihood sequence estimation decoding.

Preferably, the original bit patterns are estimated iteratively, e.g. by using iterative decoding techniques. Such iterative decoding techniques often employ maximum a-posteriori probability decoders, or maximum likelihood decoders, with message-passing algorithms.

Preferably, the estimating of the original bit pattern(s) is with reference to a set of candidates. Most preferably, the estimating of the original bit pattern(s) includes assigning a respective metric to each member of the set of candidates, as in maximum likelihood decoding. Also most preferably, the candidates are codewords that could have been used to encode the information originally stored in the cells. This is because, typically, the bit pattern(s) originally stored in the cells are portions of such codewords or even (in the case of sufficiently short codewords and MLCs with enough levels) entire such codewords. Therefore, the estimating of the original bit pattern(s) often assumes that the original bit pattern(s) included one or more such codewords. The possibility (in principle: this mode of operation is not presently a preferred mode of operation) of storing an entire codeword in a single MLC is the reason that the scope of the present invention includes applying the method of the present invention to even a single flash memory cell.

Preferably, the estimating of the original bit pattern(s) includes assigning a respective metric to each bit of each bit pattern. For example, in the MAP algorithm discussed below, each bit is assigned a decision criterion $D_i$.

Preferably, the estimation of the original bit pattern(s) is based at least in part on all of the estimated probability measures.

Preferably, the method of the present invention also includes a preliminary step of providing a flash model for the flash memory cell(s). The calculation of the estimated probabilities is in accordance with the flash model. Most preferably, the flash model includes a crossover probability matrix that defines the probability of reading any of the values corresponding to the threshold voltage bands, given any programmed voltage level value.

The scope of the present invention also includes a memory device that includes one or more flash memory cells and a controller that reads the cell(s) using the method of the present invention. The scope of the present invention also includes a system that includes a memory device that includes one or more flash memory cells and a processor that reads the cell(s) using the method of the present invention.

As noted above, the prior art includes U.S. patent application Ser. No. 11/514,182 that teaches soft decoding of hard bits. Even if only hard bits are read from flash memory cells, a probability measure for each hard bit can be provided to a soft decoder as a result of mapping each hard bit pattern to its corresponding integral voltage band. The additional use of soft bits, as in the present invention, improves the accuracy of the probability measure and so increases the probability of successfully reconstructing the original codeword for a given number of erroneous bits and increases the number of erroneous bits that can be dealt with a given probability of success.

BRIEF DESCRIPTION OF THE DRAWINGS

The invention is herein described, by way of example only, with reference to the accompanying drawings, wherein.

DESCRIPTION OF THE PREFERRED EMBODIMENTS

The principles and operation of a flash memory according to the present invention may be better understood with reference to the drawings and the accompanying description.

Figure 3A:
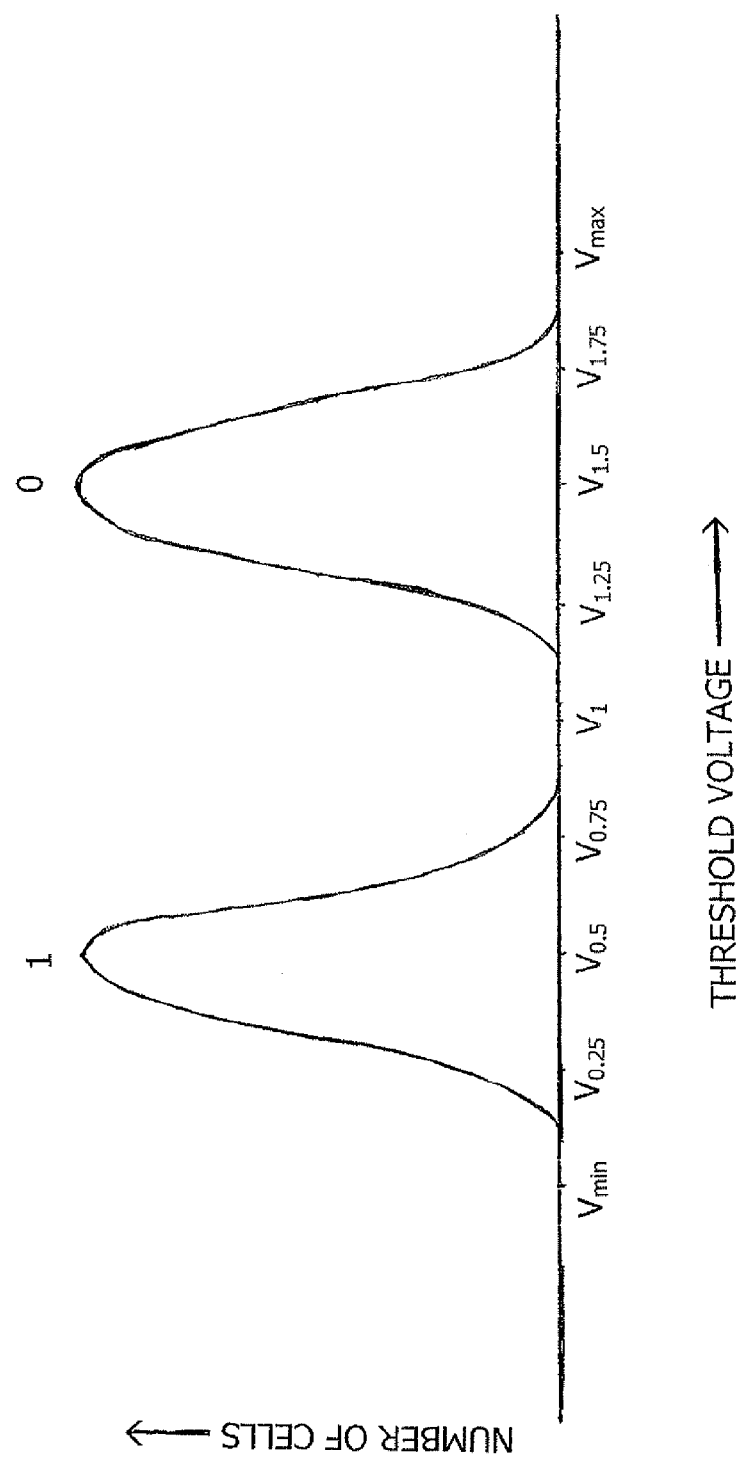
FIG. 3A illustrates the voltage bands of a collection of SLCs as programmed.
Figure 3B:
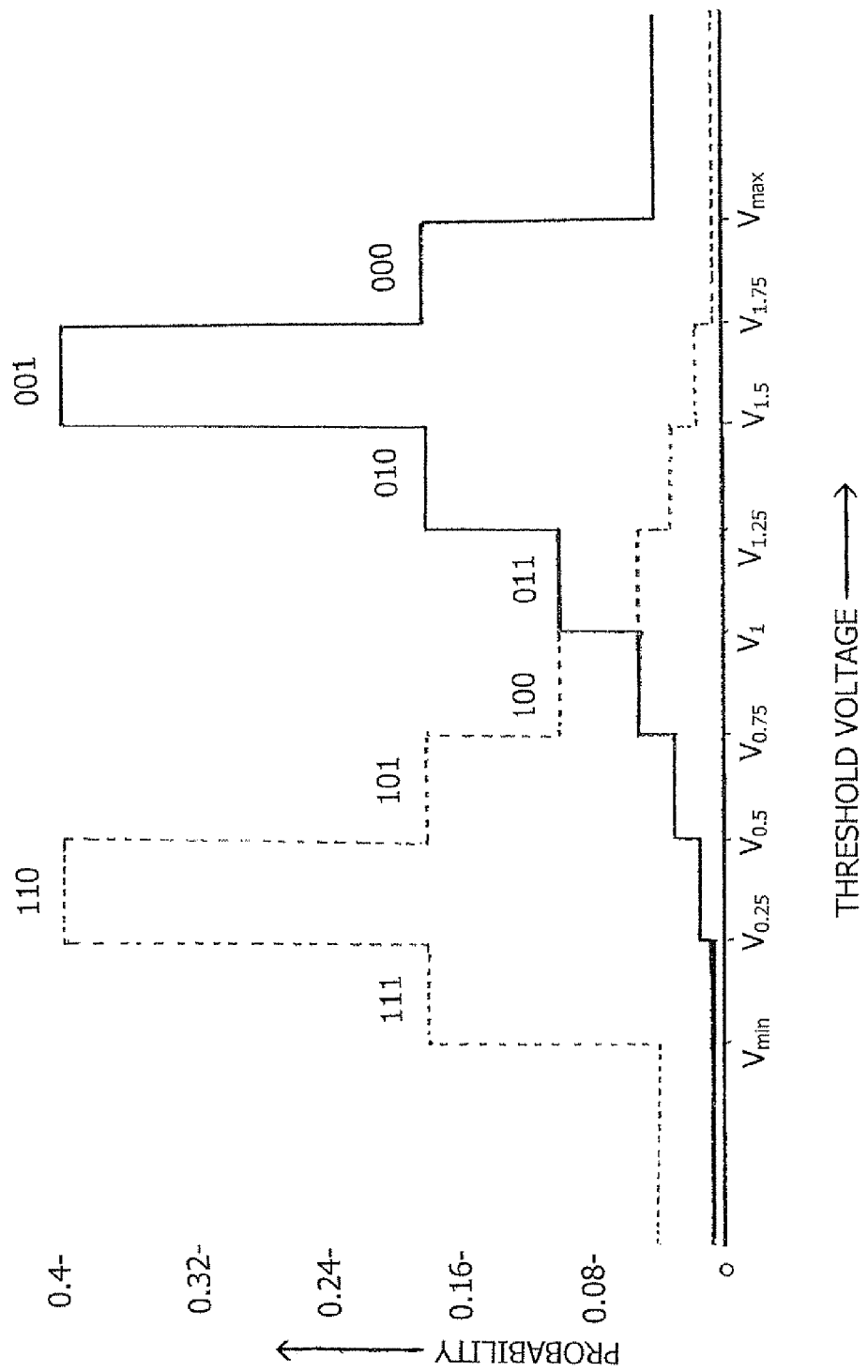
FIG. 3B shows two threshold voltage histograms for the SLCs of FIG. 3A as read.

Referring now to the drawings, FIG. 3A is an exemplary plot of the threshold voltages of a collection of SLCs as programmed, and FIG. 3B shows exemplary histograms of the threshold voltage distributions of the same collection of SLCs, as read, when the SLCs are read much later. (As discussed in U.S. patent application Publication No. 2005/0013165, also to Ban, in NAND flash technology, cells are read by being placed on serial bit-lines. Although the read circuitry is able in principle to read the threshold voltage of a single NAND cell, in practice, cells on the bit-line affect the value read and limit the accuracy with which the value can be read. This is why some SLCs that were left unprogrammed could be read as though their threshold voltages exceed $V_1$.)

In FIG. 3B, each threshold voltage range is labeled with the corresponding single hard bit and two soft bits shown as a three-bit binary number whose most significant bit is the hard bit and whose two least significant bits are the soft bits. The following table shows how a measured threshold voltage V is interpreted in terms of hard and soft bits:

| | hard bit | soft bits |
|---|---|---|
| $V < V_{0.25}$ | 1 | 11 |
| $V_{0.25} < V < V_{0.5}$ | 1 | 10 |
| $V_{0.5} < V < V_{0.75}$ | 1 | 01 |
| $V_{0.75} < V < V_1$ | 1 | 00 |
| $V_1 < V < V_{1.25}$ | 0 | 11 |
| $V_{1.25} < V < V_{1.5}$ | 0 | 10 |
| $V_{1.5} < V < V_{1.75}$ | 0 | 01 |
| $V_{1.75} < V$ | 0 | 00 |

Still in FIG. 3B, the solid histogram is a histogram of threshold voltage probabilities for cells initially programmed to "0" and the dashed histogram is a histogram of threshold voltage probabilities for cells initially programmed to "1". In tabular form, the histograms are, for cells initially programmed to "0":

| | probability |
|---|---|
| $V < V_{0.25}$ | 0.005 |
| $V_{0.25} < V < V_{0.5}$ | 0.015 |
| $V_{0.5} < V < V_{0.75}$ | 0.03 |
| $V_{0.75} < V < V_1$ | 0.05 |
| $V_1 < V < V_{1.25}$ | 0.10 |
| $V_{1.25} < V < V_{1.5}$ | 0.18 |
| $V_{1.5} < V < V_{1.75}$ | 0.40 |
| $V_{1.75} < V < V_{max}$ | 0.18 |
| $V_{max} < V$ | 0.04 | and for cells initially programmed to "1":

| | probability |
|---|---|
| $V < V_{min}$ | 0.04 |
| $V_{min} < V < V_{0.25}$ | 0.18 |
| $V_{0.25} < V < V_{0.5}$ | 0.40 |
| $V_{0.5} < V < V_{0.75}$ | 0.18 |
| $V_{0.75} < V < V_1$ | 0.10 |
| $V_1 < V < V_{1.25}$ | 0.05 |
| $V_{1.25} < V < V_{1.5}$ | 0.03 |
| $V_{1.5} < V < V_{1.75}$ | 0.015 |
| $V_{1.75} < V$ | 0.005 |

Note that the two histograms are mirror images of each other.

FIG. 3B is a pictorial representation of the following crossover probability matrix. The first row of the matrix is the probability of writing "0" and reading any of the eight possible values of the hard bit and the two soft bits. The second row of the matrix is the probability of writing "1" and reading any of the eight possible values of the hard bit and the two soft bits. The second row is the mirror image of the first row.

$$\begin{pmatrix} 0.005 & 0.015 & 0.03 & 0.05 & 0.10 & 0.18 & 0.40 & 0.22 \\ 0.22 & 0.40 & 0.18 & 0.10 & 0.05 & 0.03 & 0.015 & 0.005 \end{pmatrix}$$

An example of the use of four of these cells to store two data bits now is presented. The data bits are encoded using a rate ½ systematic linear code with four codewords as shown in the following table:

| data | codeword |
|---|---|
| 00 | 0000 |
| 10 | 1010 |
| 01 | 0101 |
| 11 | 1111 |

The Theory Section presents a Maximum A-posteriori Probability (MAP) algorithm for estimating which member of a set $\mathbb{C}$ of codewords was programmed into a set of SLCs, given a set $\underline{y}$ of bits (hard bits or both hard and soft bits) read from the SLCs and probabilities $P(y_i|x_i)$, for reading, from the i-th SLC, the hard bit plus zero or more soft bits $y_i$ given that the corresponding SLC was programmed to $x_i$. Note that $x_i$ can be either "0" or "1" and that $P(x_i=1|y_i)=1-P(x_i=0|y_i)$. Specifically, according to the Theory Section, to an initial conditional LLR, $$L_i = \log\left[\frac{P(y_i|x_i = 0)}{P(y_i|x_i = 1)}\right]$$

is added extrinsic information $E_i$ based on the codeword set $\mathbb{C}$ to give a decision criterion $D_i$. The resulting estimate $\hat{x}_i$ of the bit originally written to the i-th SLC is "0" if $D_i \geq 0$ and "1" otherwise.

Now consider four SLCs to which the codeword 1111 (i.e., $x_1=x_2=x_3=x_4=1$) has been written and whose threshold voltages $V^i$ are measured as follows:

$V_1 < V^1 < V_{1.25}$
$V_{0.75} < V^2 < V_1$
$V^3 < V_{0.25}$
$V_{0.5} < V^4 < V_{0.75}$

If the $V^i$ had been measured only relative to the single integral reference voltage $V_1$, only the hard bits $y_1=0$, $y_2=1$, $y_3=1$ and $y_4=1$ would have been read. The associated conditional probabilities are the same for all four SLCs: $P(y_i=0|x_i=0)=P(y_i=1|x_i=1)=0.9$ and $P(y_i=0|x_i=1)=P(y_i=1|x_i=0)=0.1$. The MAP algorithm of the Theory section then gives:

| i | $L_i$ | $E_i$ | $D_i$ | $\hat{x}_i$ | $P_e(\hat{x}_i)$ |
|---|---|---|---|---|---|
| 1 | 2.197 | −2.197 | 0 | 0 | 0.5 |
| 2 | −2.197 | −2.197 | −4.394 | 1 | 0.0122 |
| 3 | −2.197 | 2.197 | 0 | 0 | 0.5 |
| 4 | −2.197 | −2.197 | −4.394 | 1 | 0.0122 |

The estimated written codeword, 0101, differs from the true written codeword, 1111, in two bits, and so is an even worse estimate of the true written codeword than the hard bits as read. The resulting estimate of the encoded data bits is "01" which is incorrect. But having measured the $V^i$ relative to the fractional reference voltages gives the following hard and soft read bits and associated conditional probabilities:

| i | $y_i$ | $P(y_i|x_i = 0)$ | $P(y_i|x_i = 1)$ |
|---|---|---|---|
| 1 | 011 | 0.1 | 0.05 |
| 2 | 100 | 0.05 | 0.1 |
| 3 | 111 | 0.005 | 0.22 |
| 4 | 101 | 0.03 | 0.18 |

The MAP algorithm of the Theory section now gives:

| i | $L_i$ | $E_i$ | $D_i$ | $\hat{x}_i$ | $P_e(\hat{x}_i)$ |
|---|---|---|---|---|---|
| 1 | 0.693 | −3.784 | −3.091 | 1 | .0435 |
| 2 | −0.693 | −1.792 | −2.485 | 1 | .0769 |
| 3 | −3.784 | 0.693 | −3.091 | 1 | .0435 |
| 4 | −1.792 | −0.693 | −2.485 | 1 | .0769 | which yields a correct estimate of the written codeword and hence a correct estimate of the encoded data bits. Note that the average of the error probabilities $P_e(\hat{x}_i)$ is reduced from 25.61% to 6.02%.

The probability measures that are input to the MAP algorithm of the theory section are LLRs. Other useful probability measures are known in the art. One such probability measure is a reduced complexity LLR, for example, a LLR of reduced precision. Another such probability measure is a differential LLR: to increase the dynamic range, computations are performed in terms of the differences between the LLRs and a minimal LLR. See for example Andrei Vitayev and Paul H. Siegel, "On Viterby decoder path metric differences", *IEEE Transactions on Communications*, vol. 46 no. 12 pp. 1549-1554, December 1998. Another method of LLR resealing is taught by Andries P. Hekstra in "An alternative metric rescaling in Viterby decoders", *IEEE Transactions on Communications*, vol. 37 no. 11 pp. 1220-1222, November 1989. Yet another such probability measure is differential probability. In a SLC, this is $P_0 - P_1$, the difference between the probability that the cell was programmed to zero and the probability that the cell was programmed to one. A soft decoding method, in the field of communications, that is based on this probability measure is described in C. R. Hartmann and L. D. Rudolph, "An optimum symbol-by-symbol decoding rule for linear codes", *IEEE Transactions on Information Theory*, vol. 22 no. 5 pp. 514-517, 1976.

The MAP algorithm of the Theory Section is only exemplary. Those skilled in the art will recognize how to implement the present invention using any suitable algorithm, for example a maximum likelihood algorithm or a maximum likelihood sequence estimation algorithm or a reduced-set maximum likelihood sequence estimation algorithm. Examples of a reduced-set maximum likelihood sequence estimation algorithm are found in Fragiacomo et al., "Novel near maximum likelihood soft decision decoding algorithm for linear block codes", *IEEE*, pp. 265-270, October 1999 and in U.S. Pat. No. 6,418,172 to Raghavan.

Figure 1:
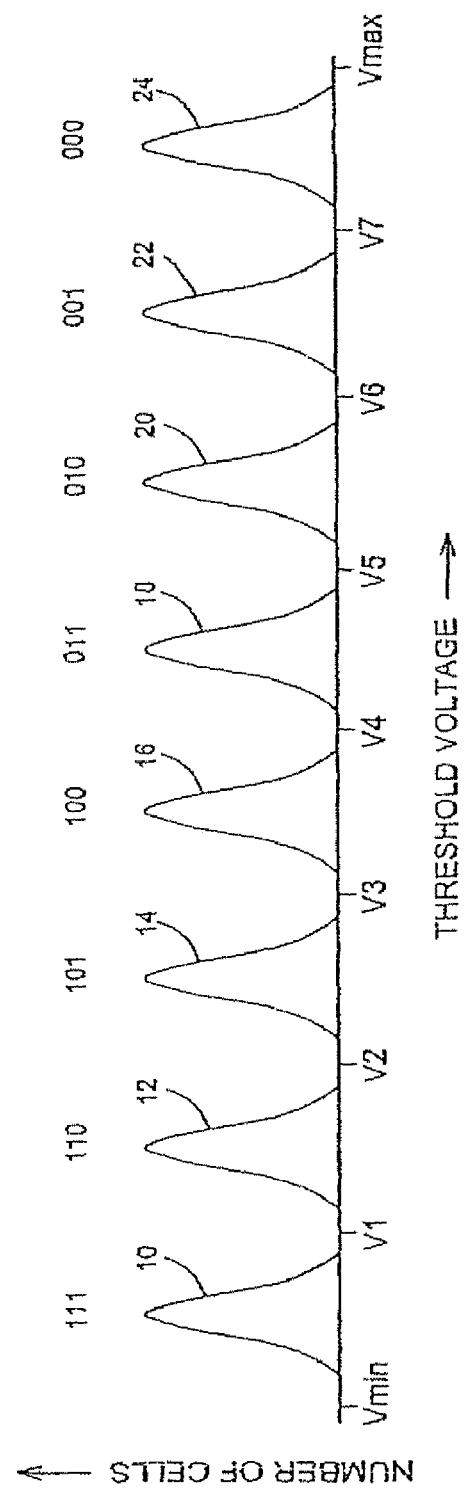
FIG. 1 illustrates the voltage bands of an eight-level MLC.
Figure 2:
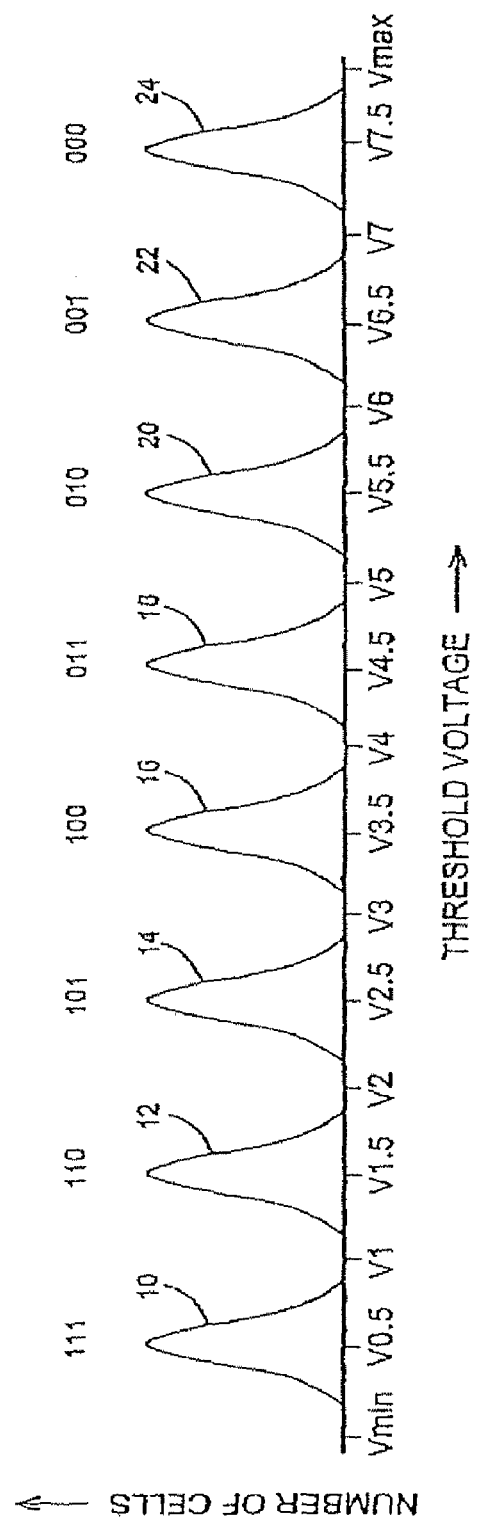
FIG. 2 is FIG. 1 including fractional reference voltages.
Figure 4:
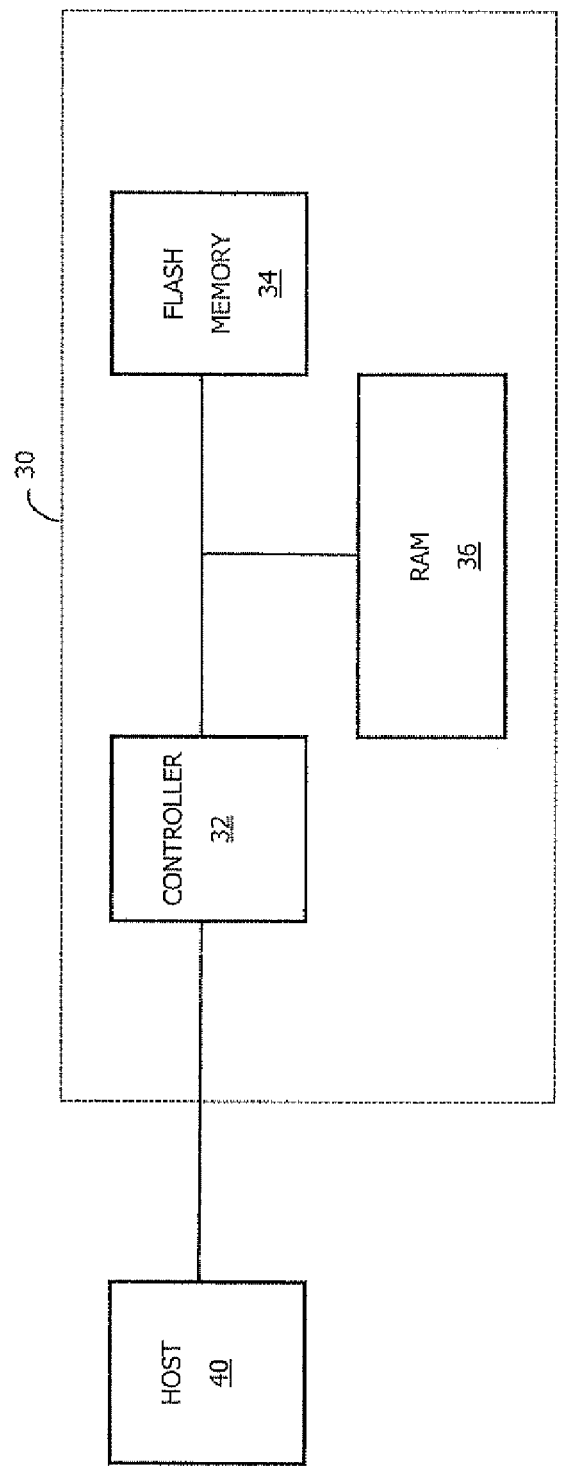
FIG. 4 is a high-level block diagram of a flash memory device of the present invention.

FIG. 4 is a high-level block diagram of a flash memory device 30 of the present invention, coupled to a host 40. FIG. 4 is adapted from FIG. 1 of Ban, U.S. Pat. No. 5,404,485, which patent is incorporated by reference for all purposes as if fully set forth herein. Flash memory device 30 includes a flash memory 34, a controller 32 and a random access memory (RAM) 36. Controller 32, that corresponds to "flash control 14" of U.S. Pat. No. 5,404,485, manages flash memory 34, with the help of RAM 36, as described in U.S. Pat. No. 5,404,485. Controller 32 also supports error correction of data read from flash memory 34 as described above.

Figure 5:
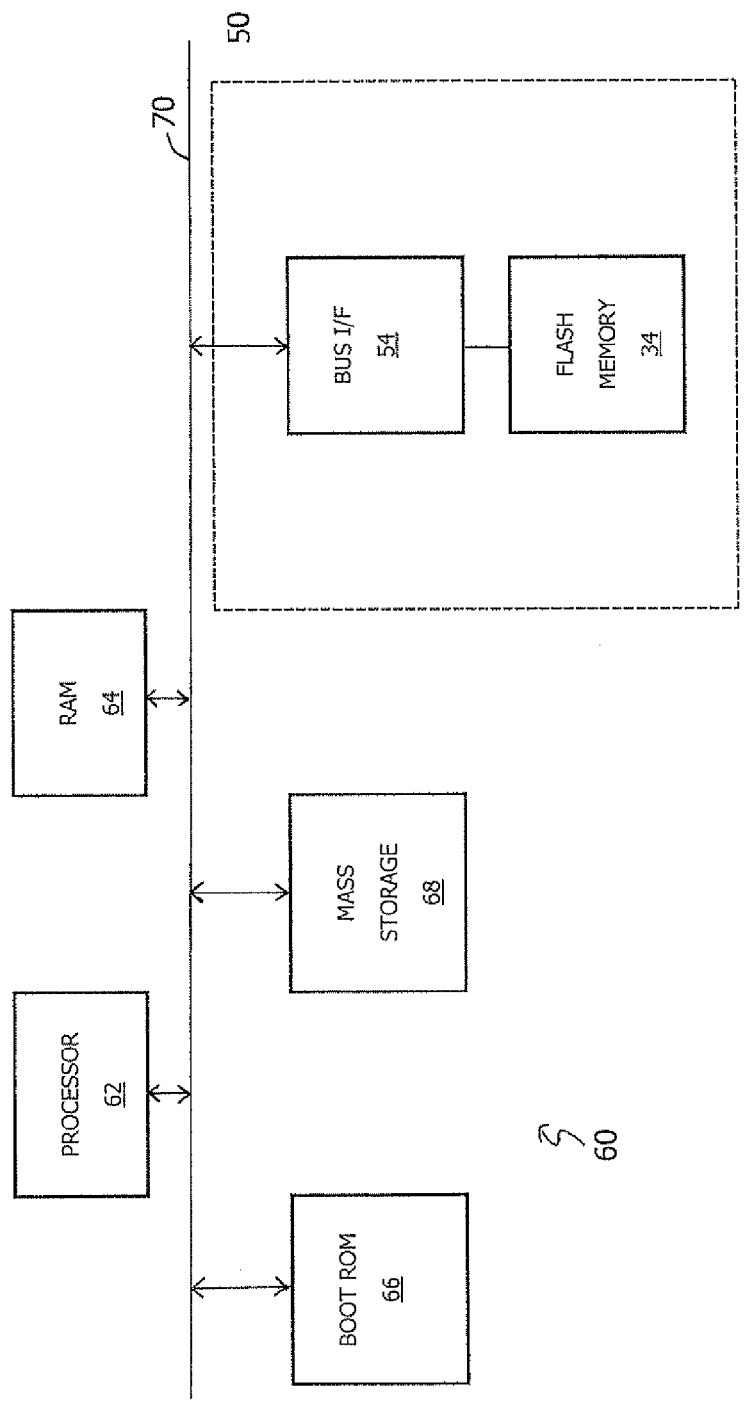
FIG. 5 is a high-level partial block diagram of a data storage system of the present invention.

FIG. 5 is a high-level partial block diagram of an alternative data storage system 60 of the present invention. Data storage system 60 includes a processor 62 and four memory devices: a RAM 64, a boot ROM 66, a mass storage device (hard disk) 68 and a flash memory device 50, all communicating via a common bus 70. Like flash memory device 30 of FIG. 4, flash memory device 50 includes a flash memory 52. Unlike flash memory device 30 of FIG. 4, flash memory device 50 lacks its own controller and RAM. Instead, processor 62 emulates controller 32 of FIG. 4 by executing a software driver that implements the methodology of U.S. Pat. No. 5,404,485 in the manner e.g. of the TrueFFS™ driver of msystems Ltd. of Kfar Saba, Israel, and that also implements the error correction methodology of the present invention. Flash memory device also includes a bus interface 54 to enable processor 62 to communicate with flash memory 52.

While the invention has been described with respect to a limited number of embodiments, it will be appreciated that many variations, modifications and other applications of the invention may be made.

Theory Section

Denote a single written bit as 'x' and a single read value as 'y'. The set of 4 written bits is denoted '$\underline{x}$' and the set of 4 read values is denoted as '$\underline{y}$'.

We consider the MAP decoder i.e. a decoder that receives some initial estimates for each of the bits and then updates the initial estimates according to the code. The MAP decoder calculates:

$$\forall i \in \{1,2,3,4\} \text{ calculate } P_r(x_i=0|\underline{y},\mathbb{C}) \tag{0.1}$$

Here '$\mathbb{C}$' denotes the code employed and '$\underline{y}$' denotes the received sequence of read values. Now the decision for each bit is according to:

$$\hat{x}_i = \begin{cases} 0 & \text{if } P_r(x_i=0|\underline{y},\mathbb{C}) \geq P_r(x_i=1|\underline{y},\mathbb{C}) \\ 1 & \text{else} \end{cases} \tag{0.2}$$

Note that:

$$P_r(x_i=0|\underline{y},\mathbb{C}) = 1 - P_r(x_i=1|\underline{y},\mathbb{C}) \tag{0.3}$$

We can replace (0.2) with:

$$\hat{x}_i = \begin{cases} 0 & \text{if } \dfrac{P_r(x_i=0|\underline{y},\mathbb{C})}{P_r(x_i=1|\underline{y},\mathbb{C})} \geq 1 \\ 1 & \text{else} \end{cases} \tag{0.4}$$

$$= \begin{cases} 0 & \text{if } \log \dfrac{P_r(x_i=0|\underline{y},\mathbb{C})}{P_r(x_i=1|\underline{y},\mathbb{C})} \geq 0 \\ 1 & \text{else} \end{cases}$$

We therefore define:

$$D_i = \log\left[\frac{P(x_i=0|\underline{y},\mathbb{C})}{P(x_i=1|\underline{y},\mathbb{C})}\right] \tag{0.5}$$

And our decision rule is therefore summarized to:

$$\hat{x}_i = \begin{cases} 0 & \text{if } D_i \geq 0 \\ 1 & \text{else} \end{cases} \tag{0.6}$$

The well known "Bayes' law" is:

$$P(x|y) = \frac{P(x|y) \cdot P(x)}{P(y)} \tag{0.7}$$

Using (0.7) formula (0.5) becomes:

$$D_i = \log\left[\frac{P(x_i=0|\underline{y},\mathbb{C})}{P(x_i=1|\underline{y},\mathbb{C})}\right] \tag{0.8}$$

-continued $$= \log\left[\frac{\dfrac{P(\underline{y}|x_i=0,\mathbb{C}) \cdot P(x_i=0|\mathbb{C})}{P(\underline{y}|\mathbb{C})}}{\dfrac{P(\underline{y}|x_i=1,\mathbb{C}) \cdot P(x_i=1|\mathbb{C})}{P(\underline{y}|\mathbb{C})}}\right]$$

It is easy to see that in the right side of (0.8) the term $P(\underline{y}|\mathbb{C})$ is reduced; therefore (0.8) is simplified to:

$$D_i = \log\left[\frac{P(\underline{y}|x_i=0,\mathbb{C}) \cdot P(x_i=0|\mathbb{C})}{P(\underline{y}|x_i=1,\mathbb{C}) \cdot P(x_i=1|\mathbb{C})}\right] \tag{0.9}$$

Assuming the information received is symmetric, i.e. the number of ones and the number of zeros to encode are equal on average then for any linear code:

$$\frac{P(x_i=0|\mathbb{C})}{P(x_i=1|\mathbb{C})} = 1, \forall i \tag{1.1}$$

Note that if the information received is not symmetric, the processor can be implemented with scrambling and descrambling units to symmetrize the information. Using (1.1) equation (0.9) becomes:

$$D_i = \log\left[\frac{P(\underline{y}|x_i=0,\mathbb{C})}{P(\underline{y}|x_i=1,\mathbb{C})}\right] \tag{1.2}$$

In (1.2) the term $P(\underline{y}|x_i=0,\mathbb{C})$ means the probability of receiving sequence '$\underline{y}$' for all code words in '$\mathbb{C}$' with '0' in bit 'i'. Mathematically, this term is defined as follows:

$$P(\underline{y}|x_i=0,\mathbb{C}) = \sum_{\underline{x} \in \mathbb{C}, x_i=0} P(\underline{y}|\underline{x}) \tag{1.3}$$

Assuming the FLASH's cells are independent from one another then:

$$P(\underline{y}|\underline{x}) = \prod_{j=1}^{N} P(y_j|x_j) \tag{1.4}$$

In both (1.3) and (1.4) '$x_j$' is element 'j' in vector '$\underline{x}$' and '$y_j$' is element 'j' in vector '$\underline{y}$'. 'N' is the number of bits in the code: 4 in our case. Introducing (1.4) and (1.3) to (1.2) we get:

$$D_i = \log\left[\frac{\sum_{\underline{x} \in \mathbb{C}, x_i=0} \prod_{j=1}^{N} P(y_j|x_j)}{\sum_{\underline{x} \in \mathbb{C}, x_i=1} \prod_{j=1}^{N} P(y_j|x_j)}\right] \tag{1.5}$$

Using the fact that in the nominator of (1.5) in all code words at location 'i' bit 'x' is zero ($x_i=0$) we can re-write the nominator of (1.5) as follows:

$$\sum_{\substack{x \in C, \\ x_i=0}} \prod_{j=1}^{N} P(y_j | x_j) = P(y_i | x_i = 0) \cdot \sum_{\substack{x \in C, \\ x_i=0}} \prod_{\substack{j=1, \\ j \neq i}}^{N} P(y_j | x_j) \quad (1.6)$$

Introducing (1.6) into (1.5) and employing the same for the denominator we get:

$$D_i = \log\left[\frac{P(y_i | x_i = 0)}{P(y_i | x_i = 1)}\right] + \log\left[\frac{\sum_{\substack{x \in C, \\ x_i=0}} \prod_{\substack{j=1, \\ j \neq i}}^{N} P(y_j | x_j)}{\sum_{\substack{x \in C, \\ x_i=1}} \prod_{\substack{j=1, \\ j \neq i}}^{N} P(y_j | x_j)}\right] \quad (1.7)$$

We define:

$$L_i = \log\left[\frac{P(y_i | x_i = 0)}{P(y_i | x_i = 1)}\right]; \quad (1.8)$$

$$E_i = \log\left[\frac{\sum_{\substack{x \in C, \\ x_i=0}} \prod_{\substack{j=1, \\ j \neq i}}^{N} P(y_j | x_j)}{\sum_{\substack{x \in C, \\ x_i=1}} \prod_{\substack{j=1, \\ j \neq i}}^{N} P(y_j | x_j)}\right]$$

With definition (1.8) equation (1.7) becomes:

$$D_i = L_i + E_i \quad (1.9)$$

We now continue to further develop $L_i$ and $E_i$. Going back to 'Bayes' Law' we re-write $L_i$ as follows:

$$L_i = \log\left[\frac{P(y_i | x_i = 0)}{P(y_i | x_i = 1)}\right] \log\left[\frac{P(x_i = 0 | y_i) \cdot P(y_i) \cdot P(x_i = 1)}{P(x_i = 1 | y_i) \cdot P(y_i) \cdot P(x_i = 0)}\right] \quad (2.1)$$

Introducing (1.1) into (2.1) we get that:

$$L_i = \log\left[\frac{P(x_i = 0 | y_i)}{P(x_i = 1 | y_i)}\right] \quad (2.2)$$

From (2.2) we learn that in our case $L_i$ is the initial estimation for bit 'i' regardless of the code, even though $L_i$ is calculated via (1.8) in practice. And therefore $E_i$ is the extrinsic information, meaning the update to the initial estimation $L_i$ obtained from the decoding process.

Using (0.3) and $L_i$ as in (2.2) we conclude that $L_i$ (the LLR) is bijective with the probability $P(x_i=0|y_i)$ as follows:

$$z \triangleq P(x_i = 0 | y_i), L_i = \log\left[\frac{z}{1-z}\right], z = \frac{e^{L_i}}{1+e^{L_i}} \quad (2.3)$$

Now assuming that bit $x_i=1$ was written but the decoder has decided erroneously that $\hat{x}_i=0$, the probability of this error is:

$$P_r(x_i \neq \hat{x}_i | \underline{y}) = \begin{cases} z & \text{for } \hat{x} = 1 \\ 1-z & \text{for } \hat{x} = 0 \end{cases} = \begin{cases} \frac{e^{D_i}}{1+e^{D_i}} & \text{for } \hat{x} = 1 \\ \frac{1}{1+e^{D_i}} & \text{for } \hat{x} = 0 \end{cases} \quad (2.4)$$

Equation (2.4) can be re-written as follows:

$$P_r(\hat{x}_i \neq x_i | \underline{y}) = \left(\frac{1}{1+e^{D_i}}\right)^{1-\hat{x}_i} \cdot \left(\frac{e^{D_i}}{1+e^{D_i}}\right)^{\hat{x}_i} \quad (2.5)$$

Summary:

I. A Priori Information Fed to the Decoder:
The possible code words that could have been written.
The flash model, i.e. $P(y_i|x_i)$ for any possible 'y' and $x \in \{0, 1\}$.

II. Decoding:
For each bit the algorithm receives '$\underline{y}$' the set of values read from the flash. In the event of soft bits '$\underline{y}$' includes more than 1 bit for each value 'y'.
From '$\underline{y}$' a set of initial LLR estimations $\underline{L}$ are composed. For bit 'i' $L_i$ is:

$$L_i = \log\left[\frac{P(x_i = 0 | y_i)}{P(x_i = 1 | y_i)}\right] \quad (3.1)$$

Given '$\underline{y}$', and the a priori information, an update $D_i$ for bit 'i' is calculated as follows:

$$D_i = L_i + E_i; E_i = \log\left[\frac{\sum_{\substack{x \in C, \\ x_i=0}} \prod_{\substack{j=1, \\ j \neq i}}^{N} P(y_j | x_j)}{\sum_{\substack{x \in C, \\ x_i=0}} \prod_{\substack{j=1, \\ j \neq i}}^{N} P(y_j | x_j)}\right] \quad (3.2)$$

A decision whether bit 'i' is '1' or '0' is taken as follows:

$$\hat{x}_i = \begin{cases} 0 & \text{if } D_i \geq 0 \\ 1 & \text{else} \end{cases} \quad (3.3)$$

The probability of error in decoding for the specific bit is:

$$P_e(i) = P_r(err, \text{bit } i) = P_r(\hat{x}_i \neq x_i | \underline{y}) = \left(\frac{1}{1+e^{D_i}}\right)^{1-\hat{x}_i} \cdot \left(\frac{e^{D_i}}{1+e^{D_i}}\right)^{\hat{x}_i} \quad (3.4)$$

What is claimed is:

1. A method of reading at least one flash memory cell, comprising the steps of:
   (a) for each cell:
      (i) comparing a threshold voltage of said each cell to at least one integral reference voltage, (ii) comparing said threshold voltage of said each cell to at least one fractional reference voltage, and (iii) based at least in part on outcomes of said comparisons, calculating a respective estimated probability measure of each bit of a bit pattern of said each cell, thereby obtaining a plurality of estimated probability measures; and (b) estimating a respective original bit pattern of each cell, based at least in part on at least two of said estimated probability measures.

2. The method of claim 1, wherein, for each cell, said threshold voltage of said each cell is compared to a plurality of integral reference voltages.

3. The method of claim 1, wherein said estimated probability measures are initial estimated probability measures.

4. The method of claim 3, wherein said estimating of said at least one original bit pattern includes transforming said initial estimated probability measures into final estimated probability measures.

5. The method of claim 4, wherein said transforming is constrained by said at least one original bit pattern collectively being a member of a set of candidates.

6. The method of claim 5, wherein said candidates are codewords.

7. The method of claim 4, wherein said estimating of said at least one original bit pattern is based on said final estimated probability measures.

8. The method of claim 1, wherein said estimating of said at least one original bit pattern includes maximum a-posteriori probability decoding.

9. The method of claim 1, wherein said estimating of said at least one original bit pattern includes maximum likelihood decoding.

10. The method of claim 9, wherein said maximum likelihood decoding includes maximum likelihood sequence estimation decoding.

11. The method of claim 10, wherein said maximum likelihood sequence estimation decoding includes reduced set maximum likelihood sequence estimation decoding.

12. The method of claim 1, wherein said estimating is effected iteratively.

13. The method of claim 1, wherein said estimating of said at least one original bit pattern is with reference to a set of candidates.

14. The method of claim 13, wherein said estimating of said at least one original bit pattern includes assigning a respective metric to each member of said set of candidates.

15. The method of claim 13, wherein said candidates are codewords.

16. The method of claim 1, wherein said estimating of said at least one original bit pattern includes assigning a respective metric to each said bit of said at least one bit pattern.

17. The method of claim 1, wherein said estimating is based at least in part on all said estimated probability measures.

18. The method of claim 1, further comprising the step of:

(c) providing a flash model for the at least one cell, said calculating of said estimated probability measures then being in accordance with said flash model.

19. The method of claim 18, wherein said flash model includes a crossover probability matrix.

20. A memory device comprising:

(a) at least one flash memory cell; and (b) a controller operative to read said at least one cell by:
  (i) for each said cell:
    (A) comparing a threshold voltage of said each cell to at least one integral reference voltage,
    (B) comparing said threshold voltage of said each cell to at least one fractional reference voltage, and
    (C) based at least in part on outcomes of said comparisons, calculating a respective estimated probability measure of each bit of a bit pattern of said each cell,
  thereby obtaining a plurality of estimated probability measures, and
  (ii) estimating a respective original bit pattern of each said cell, based at least in part on at least two of said estimated probability measures.

21. A system comprising:

(a) a memory device that includes at least one flash memory cell; and (b) a processor operative to read said at least one cell by:
  (i) for each said cell:
    (A) comparing a threshold voltage of said each cell to at least one integral reference voltage,
    (B) comparing said threshold voltage of said each cell to at least one fractional reference voltage, and
    (C) based at least in part on outcomes of said comparisons, calculating a respective estimated probability measure of each bit of a bit pattern of said each cell,
  thereby obtaining a plurality of estimated probability measures, and
  (ii) estimating a respective original bit pattern of each said cell, based at least in part on at least two of said estimated probability measures.

* * * * *